(12) United States Patent
Kim et al.

(10) Patent No.: US 7,120,414 B2
(45) Date of Patent: Oct. 10, 2006

(54) CIRCUIT AND METHOD FOR RECEIVING AND MIXING RADIO FREQUENCIES IN A DIRECT CONVERSION RECEIVER

(75) Inventors: Young-Jin Kim, Yongin (KR); In-Chul Hwang, Seoul (KR)

(73) Assignee: Samsung Electronics Co., Ltd., (KR)

( * ) Notice: Subject to any disclaimer, the term of this patent is extended or adjusted under 35 U.S.C. 154(b) by 399 days.

(21) Appl. No.: 10/816,165

(22) Filed: Apr. 1, 2004

(65) Prior Publication Data

US 2004/0214547 A1 Oct. 28, 2004

(30) Foreign Application Priority Data

Apr. 28, 2003 (KR) .................... 10-2003-0026686

(51) Int. Cl.
*H04B 1/26* (2006.01)
*G01V 3/02* (2006.01)
(52) U.S. Cl. .................. 455/313; 455/323; 455/333; 455/318; 327/359
(58) Field of Classification Search ................ 455/313, 455/318, 320, 323, 330, 333, 334; 327/356, 327/359, 327, 313, 355; 330/296, 261, 311
See application file for complete search history.

(56) References Cited

U.S. PATENT DOCUMENTS 6,192,225 B1 2/2001 Arpaia et al.
6,242,965 B1* 6/2001 Pickering et al. ........... 327/359
6,329,864 B1* 12/2001 Suematsu et al. ........... 327/356
6,871,057 B1* 3/2005 Ugajin et al. ............... 455/323
7,035,615 B1* 4/2006 Kim et al. ................... 455/317
2002/0011890 A1* 1/2002 Kaneki et al. .............. 327/359
2002/0042257 A1* 4/2002 Sorrells et al. ............. 455/313
2003/0092416 A1* 5/2003 Tanaka et al. .............. 455/323

FOREIGN PATENT DOCUMENTS

KR 1020020068128 8/2002

* cited by examiner

*Primary Examiner*—Lana Le
(74) *Attorney, Agent, or Firm*—F. Chau & Associates, LLC

(57) ABSTRACT

A frequency mixing circuit and a frequency mixing method. The frequency mixing circuit includes first and second differential amplifiers, a subtracter and a mixer. The first differential amplifier amplifies a first pair of input signals having a first frequency to generate a first differential signal. The second differential amplifier amplifies a second pair of input signals having the first frequency orthogonal to the first pair input signals to generate a second differential signal. The subtracter subtracts the second differential signal from the first differential signal. The mixer mixes the subtracted signal with a first and second pairs of drive signals having a second frequency orthogonal to each other, in a sub-harmonic double balanced mixing mode, so that the mixer generates a pair of output signals orthogonal to each other without secondary harmonics.

28 Claims, 7 Drawing Sheets

CIRCUIT AND METHOD FOR RECEIVING AND MIXING RADIO FREQUENCIES IN A DIRECT CONVERSION RECEIVER

BACKGROUND OF THE INVENTION

1. Field of the Invention

The present invention relates to direct conversion receivers and circuits and methods for receiving and mixing radio frequencies, and more particularly to a circuit and a method that can diminish a secondary-order inter modulation distortion at a direct conversion receiver.

2. Description of the Related Art

Generally, the direct conversion receiver or a homodyne receiver provides advantages compared to a superheterodyne receiver.

FIG. 1 is a radio frequency receiving circuit diagram of a conventional direct conversion receiver (DCR).

Referring to FIG. 1, the direct conversion receiver transforms an input signal into an inphase signal and a quadrature signal having a baseband frequency without transforming the input signal into a signal having an intermediate frequency (IF).

A radio frequency (RF) signal received by an antenna 10 is inputted to a low noise amplifier 12, and then an output signal of the low noise amplifier 12 is inputted to each of a first mixer 14 and a second mixer 16.

At the first mixer 14, the amplified radio frequency signal is mixed with a local oscillator signal 20 such as a cosine wave signal of a local oscillator 20. The local oscillator signal 20 has a same frequency as a carrier frequency. At the second mixer 16, the radio frequency signal is mixed with a sine wave. The sine wave has phase difference of 90° with respect to the local oscillator signal 20, and generated by a π/2 phase shifter 18.

The first and second mixers 14 and 16 generate the inphase signal and the quadrature signal, respectively, which have a mean frequency such as the baseband frequency and a harmonic frequency such as a twice carrier frequency (2fc). Harmonics of the signals generated by the first and second mixers 14 and 16 are removed by two low pass filters 22 and 24, respectively. The inphase signal and the quadrature signal having baseband frequency are amplified and outputted by two amplifiers 26 and 28, respectively.

The DCR has a simple circuit configuration compared with the superheterodyne receiver, and is easier to implement as an integrated circuit. The a minimized DCR circuit can be manufactured at a low cost.

However, the DCR has some problems. One of the problems is a secondary intermodulation distortion generated by the mixer. The secondary intermodulation distortion is caused by the mixer having a nonlinear active device. A harmonic frequency component of the output signal is generated by a radio frequency signal process using the nonlinear active device, and may be a sum or difference of the harmonics of two different input signals. A DC offset is generated in addition to unwanted secondary harmonics by a non-linearity of the mixer.

When two input signals respectively having two frequency components f1 and f2 are inputted into a nonlinear circuit, frequency components such as 2f1, 2f2, f1+f2, 3f1, 3f2, 2f1−f2, 2f2−f1, 2f1+f2 or 2f2+f1 are generated due to the non-linearity of the nonlinear circuit as well as f1, f2. In general, a filter removes the frequency components caused by a non-linearity.

When the input signal frequencies f1 and f2 are slightly different from each other and an application defines the baseband frequency as the mean frequency, the frequency component of f1−f2 that is close to the baseband frequency is not removed by the filter. The frequency component due to the non-linearity is presented in the form of interference among channels having a small frequency difference, or in signal distortions by mutual interference of the signals in a signal band.

The frequency component of f1−f2 is referred to as the secondary intermodulation distortion (IMD2). The linearity of circuit is represented by a relation between the IMD2 quantity and a quantity of an amplified input signal frequency. A value representing the linearity of circuit is referred to as a second order intercept point (IP2).

Additionally, because the DCR shifts the frequency of the desired signal to the baseband, the IMD2 generated by the mixer can deteriorate the function of the DCR.

To solve above mentioned problem, some attempts have been suggested.

One of the attempts is to control mismatches of load resistances to equalize phases of the outputted secondary harmonics, and to equalize amplitudes of the outputted secondary harmonics, so that the secondary harmonics is removed by differential inputs. The effectiveness of the method of the matching load resistances depends on how finely the load resistances are controlled. However, the precise control of the load resistances is limited by a fabrication process of the integrated semiconductor circuit.

Another method is disclosed in Korean Patent Laid-Open Publication Nos. 2001-34820 (that corresponds to U.S. patent application Ser. No. 09/064,930), and 2002-68128.

In Korean Patent Laid-Open Publication No. 2001-34820, the IMD2 is transformed out of a pass band of a low pass filter and removed, by a switching operation of an inverter for an outputted signal polarity of a mixer,. In addition, a switching frequency of the inverter is high as compared with bandwidth of an input signal.

According to the disclosure in Korean Patent Laid-Open Publication No. 2002-68128, the IMD2 is minimized by circuit configuration biased in region in which a first differential function of transconductance of a complementary active device has a maximum and minimum values.

SUMMARY OF THE INVENTION

The present invention provides a frequency mixing circuit and a frequency mixing method for removing a secondary intermodulation distortion (IMD2) that improves linearity.

It is another aspect of the present invention to provide a radio frequency receiving circuit and a radio frequency receiving method using the frequency mixing circuit and the frequency mixing method.

In one aspect of the present invention, the first embodiment of the frequency mixing circuit includes a first differential amplifier, a second differential amplifier, a subtracter and a mixer. The first differential amplifier amplifies a first pair of input signals RF1 and RF2 with a first frequency f1 to generate a first differential output signal. The second differential amplifier amplifies a second pair of input signals RF3 and RF4 orthogonal to the first pair input signals RF1 and RF2 to generate a second differential output signal. The subtracter subtracts the second differential output signal from the first differential output signal, so that the subtracter generates a subtracted signal. The mixer mixes the subtracted signal, a first pair of drive signals L01 and L02 and a second pair of drive signals L03 and L04 orthogonal to each other, in a sub-harmonic double balanced mixing mode, so that the mixer generates a pair of output signals orthogonal to each other without secondary harmonics.

In the second embodiment the frequency mixing circuit has the same circuit configuration as the first embodiment of the frequency mixing circuit, except that the mixer includes a Gilbert cell circuit in place of a sub-harmonic double balanced mixing circuit of the first embodiment.

In the third embodiment, the frequency mixing circuit includes one differential amplifier, a harmonic rejection circuit and a mixer. The differential amplifier amplifies a first pair of input signals RF1 and RF2 having a first frequency f1, so that the differential amplifier generates a first current signal at a first node and a second current signal at a second node. The harmonic rejection circuit reacts to a second pair of input signals RF3 and RF4 orthogonal to each other, having a substantially same frequency as the first frequency f1, so that the harmonic rejection circuit generates a third current signal at the first node and a fourth current signal at the second node. The mixer mixes the current signals at the first and second nodes, with a first pair of drive signals L01 and L02 and a second pair of drive signals L03 and L04 (orthogonal to the first pair of drive signals L01 and L02) having a second frequency f2, in a sub-harmonic double balanced mixing mode, so that the mixer generates a pair of output signals orthogonal to each other.

In one embodiment of the frequency mixing method, the method includes generation of a first differential signal, a second differential signal, a subtracted signal, and a pair of output signals. The first differential signal is produced by amplifying a first pair of input signals with a first frequency. The second differential signal is produced by amplifying a second pair of input signals having a substantially same frequency as the first pair input signals, and is orthogonal to the first pair input signals. The subtracted signal is produced by subtracting the second differential signal from the first differential signal. The pair of output signals is produced by mixing the subtracted signal, with a first pair of drive signals and a second pair of drive signals having a second frequency. The mixing process uses a sub-harmonic double balanced mode so that the pair of output signal is orthogonal to each other and secondary harmonics are removed.

In another embodiment of the frequency mixing method, the method includes generation of a first differential signal, a second differential signal, a subtracted signal, and a pair of output signals by using a double balanced mixing mode. The first differential signal is produced by amplifying a first pair of input signals having a first frequency. The second differential signal is produced by amplifying a second pair of input signals having a substantially same frequency as the first frequency, and is orthogonal to the first pair input signals. The subtracted signal is produced by subtracting the second differential signal from the first differential signal. The pair of output signals is produced by mixing the subtracted signal with a pair of drive signals having a second frequency. The mixing method uses a sub-harmonic double balanced mode so that the pair of output signal are orthogonal to each other, and a secondary harmonic is removed.

In still another embodiment of the frequency mixing method, the method includes generation of a first current signal and a second current signal, a first subtracted signal and a second subtracted signal, and a pair of output signals. The first and second current signals are produced by amplifying a first pair of input signals RF1 and RF2 having a first frequency f1. The first and second subtracted signals are produced by respectively subtracting a third current signal and a fourth current signal from the first and second current signals. The subtraction is an operation responding to a second pair of input signals RF3 and RF4 that have a substantially same frequency as the first frequency and are orthogonal to the first pair of input signals. The pair of output signals is produced by mixing the first subtracted signal, the second subtracted signal, a first and a second pair of drive signals orthogonal to each other with a second frequency f2. The mixing uses a sub-harmonic double balanced mixing mode so that the pair of output signals is orthogonal to each other.

In another aspect of the present invention, the first embodiment of the radio frequency receiving circuit includes a first poly-phase filter, a second poly-phase filter, a first mixer and a second mixer. The first and second mixers have a sub-harmonic double balanced active mixer adapted to cancel harmonics. The first poly-phase filter transforms a radio frequency signal having a first frequency into a first and second pairs of input signals orthogonal to each other. The second poly-phase filter transforms a local oscillator signal having a second frequency into first and second signal groups that each includes a pair of drive signals having about 45°-phase difference from each other. The first mixer is coupled to the first and second poly-phase filters. Additionally, the first mixer mixes the two pairs of input signals and a pair of drive signals in the first group signal to generate a first output signal having a third frequency. The second mixer coupled to the first and second poly-phase filters mixes the two pairs of input signals and a pair of drive signals in the second group signal to generate a second output signal having a substantially same frequency as the third frequency.

In another aspect of the present invention, the second embodiment of the radio frequency receiving circuit includes a first poly-phase filter, a second poly-phase filter, a first mixer and a second mixer. The first or second mixer has a double balanced active mixing circuit that is widely known as a Gilbert cell circuit. The first poly-phase filter transforms a radio frequency having a first frequency into two pairs of input signals orthogonal to each other. The second poly-phase filter transforms a local oscillator signal having a second frequency into two pairs of drive signals orthogonal to each other. The first mixer coupled to the first and the second poly-phase filters mixes the two pairs of input signals and one pair of drive signals to generate a first output signal having a third frequency. The second mixer coupled to the first and the second poly-phase filters mixes the two pairs of input signals and the other pair of drive signals to generate a second output signal having a substantially same frequency as the third frequency.

In another aspect of the present invention, one embodiment of the radio frequency receiving method includes generation of two pairs of input signals, the first and second signal groups, a first output signal and a second output signal. The two pairs of input signals are produced by transforming a radio frequency signal, and are orthogonal to each other. The first and second signal groups are produced by transforming a local oscillator signal. Additionally, the first and second signal groups have about 45°-phase difference from each other and each signal group has two pairs of drive signals orthogonal to each other. The first output signal is produced by mixing the two pairs of input signals and the two pairs of the first group's signals. The first output signal has a third frequency. The second output signal is produced by mixing the two pairs of input signals and the two pairs of the second group signals. The second output signal has a substantially same frequency as the third frequency.

In another aspect of the present invention, another embodiment of the radio frequency receiving method includes generation of two pairs of input signals, two pairs of drive signals, a first output signal, and a second output signal. The two pairs of input signals are generated by transforming a radio frequency signal having a first frequency. The two pairs of input signals are orthogonal to each other. The two pairs of drive signals are generated by transforming a local oscillator signal having a second frequency, so that the two pairs of drive signals are orthogonal to each other. The first output signal is produced by mixing the two pairs of input signals and one pair of drive signals. The first output signal has a third frequency. The second output signal is produced by mixing the two pairs of input signals and the other pair of drive signals. The second output signal has a substantially same frequency as the third frequency.

The present invention renders the secondary intermodulation distortion IMD2 reduced by changing input structure of the mixing circuit that receives the radio frequency signal, so that removing the secondary harmonics improves the linearity of the mixing circuit and the quality of receiving circuit.

BRIEF DESCRIPTION OF THE DRAWINGS

The above and other features of the present invention will become more apparent by describing in detail the preferred embodiments thereof with reference to the accompanying drawings, in which.

DESCRIPTION OF THE PREFERRED EMBODIMENTS

Hereinafter, the preferred embodiments of the present invention will be described in detail with reference to the accompanying drawings.

Exemplary Embodiments as a Frequency Mixing Circuit

Embodiment 1

Figure 1:
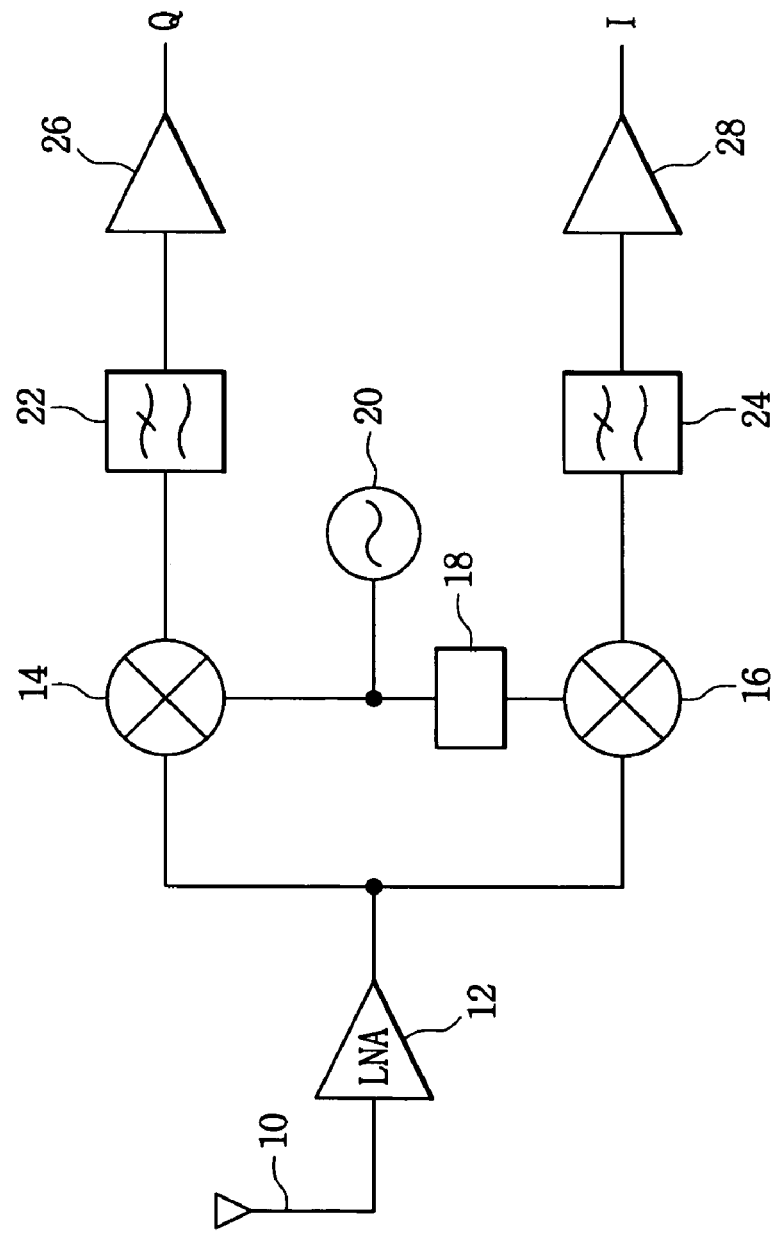
FIG. 1 is a circuit diagram of a conventional radio frequency receiving direct conversion receiver.
Figure 2:
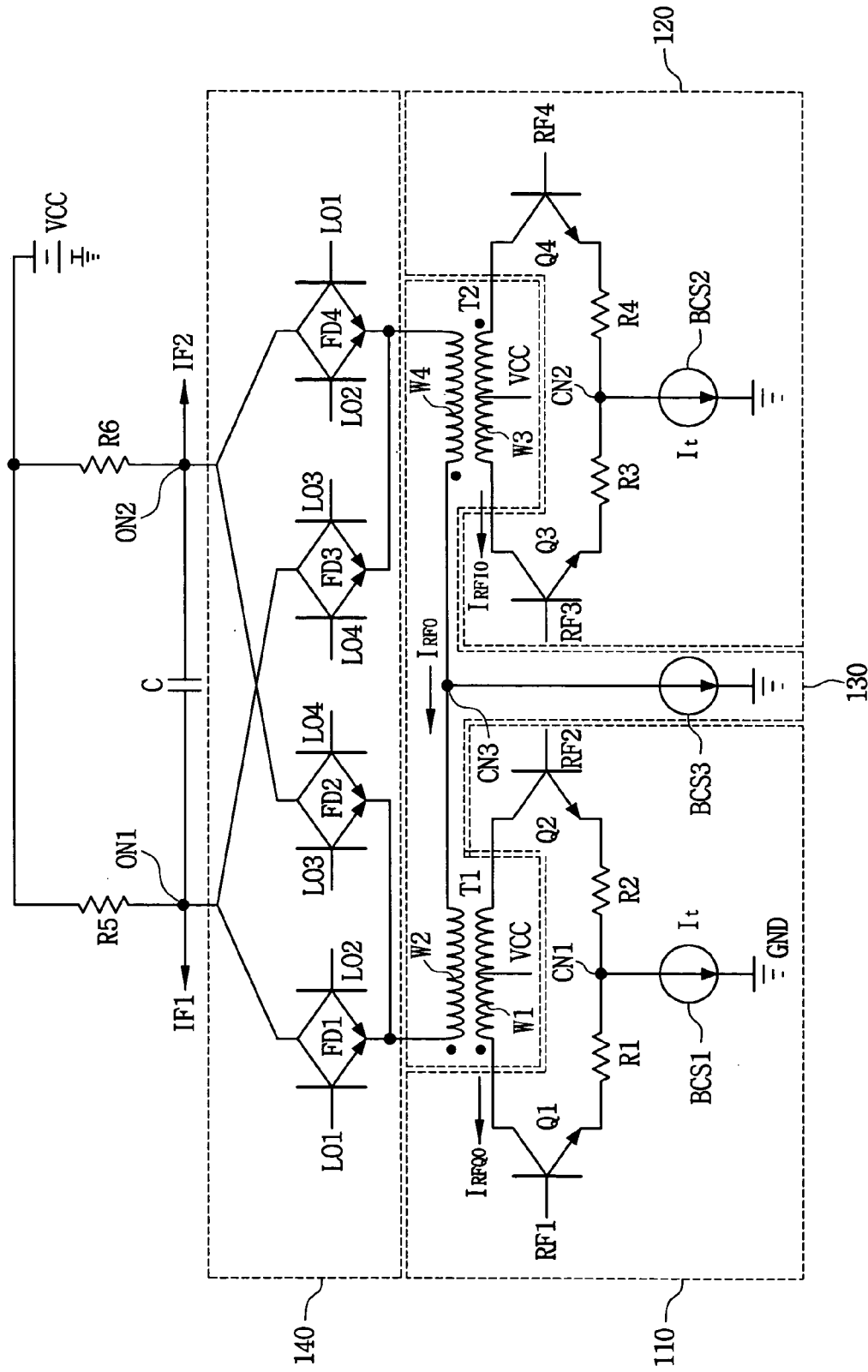
FIG. 2 is a circuit diagram of a harmonic rejection mixing circuit according to a first embodiment of the present invention.

FIG. 2 is a circuit diagram of a harmonic rejection mixing circuit according to a first embodiment of the present invention.

Referring to FIG. 2, a frequency mixing circuit 100 comprises a first differential amplifier 110, a second differential amplifier 120, a subtracter 130 and a mixer 140.

The first differential amplifier 110 has a pair of an emitter coupled transistors Q1 and Q2 that are emitter coupled at first common node CN1. The first transistor Q1 has a base receiving a first input signal RF1 and the second transistor Q2 has a base receiving a second input signal RF2. The first input signal RF1 and the second input signal RF2 are 180° out of phase with respect to each other, and become a first pair input signals. The first differential amplifier 110 generates a first amplified signal $I_{RFQ0}$ by amplifying the first pair input signals RF1 and RF2. A first bias current source BCS1 is connected between the first common node CN1 (of the emitter coupled transistors Q1 and Q2) and a ground GND. The first bias current source BCS1 supplies a bias current $I_t$ to the first common node CN1. A first regeneration resistor R1 is connected between the first common node CN1 and the emitter of the transistor Q1. A second regeneration resistor R2 is connected between the first common node CN1 and the emitter of the transistor Q2. The first and second regeneration resistors R1 and R2 are a matching pair.

The second differential amplifier 120 has a pair of an emitter coupled transistors Q3 and Q4 that are emitter-coupled at a second common node CN2. One of the emitter coupled transistors (Q3) has a base receiving a third input signal RF3, and the other of the emitter coupled transistors (Q4) has a base receiving a fourth input signal RF4. The third input signal RF3 and the fourth input signal RF4 are 180° out of phase with respect to each other, and become a second pair of input signals. The second differential amplifier 120 generates a second amplified signal $I_{RF10}$ by amplifying the second pair input signals RF3 and RF4. Additionally, the second pair input signals are 90° out of phase with respect to the first pair input signals. A second bias current source BCS2 is connected between a second common node CN2 of the emitter coupled transistors Q3 and Q4 and the ground GND. The second bias current source supplies a bias current $I_t$ to the second common node CN2. A third regeneration resistor R3 is connected between the second common node CN2 and the emitter of the transistor Q3. A fourth regeneration resistor R4 is connected between the second common node CN2 and the emitter of the transistor Q4. The third and fourth regeneration resistors become a matching pair.

The subtracter 130 has a first transformer T1, a second transformer T2 and a third current source BCS3. The subtracter 130 generates a subtraction signal $I_{RF0}$ by subtracting the second amplified signal $I_{RF10}$ from the first amplified signal $I_{RFQ0}$.

The first transformer T1 has a first winding W1 and a second winding W2 that are magnetically coupled to each other and have the same polarity with respect to each other. One terminal of the first winding W1 is connected to the collector of transistor Q1, and the other terminal of the first winding W1 is connected to the collector of transistor Q2. A center tap is connected to a voltage source VCC. The first amplified signal $I_{RFQ0}$ at the first winding W1 is inductively coupled to the second winding W2.

The second transformer T2 has a third winding W3 and a fourth winding W4 that are magnetically coupled to each other and have an opposite polarity with respect to each other. A polarity of the third winding W3 is opposite to the polarity of the first winding W1 of the first transformer T1. The polarity of the fourth winding W4 is same with the polarity of the second winding W2. One terminal of the third winding W3 is connected to the collector of transistor Q3, and the other terminal of the third winding W3 is connected to the collector of transistor Q4. The center tap of the third winding W3 of the second transformer T2 is connected to the voltage source VCC. The second amplified signal $I_{RF10}$ at the third winding W3 is inductively coupled to the second winding W4.

One terminal of the second winding W2 is connected to the mixer 140, and the other terminal of the second winding W2 is connected to a third common node CN3. One terminal of the fourth winding W4 is connected to the third common node CN3 and the other terminal of the fourth winding W4 is connected to the mixer 140. A third bias current source BCS3 is connected between the third common node and the ground GND. The third bias current source BCS2 applies DC current to the mixer 140.

Thus, a subtraction of the first amplified signal and the second amplified signal is performed by a coupled configuration of the first and the second transformers T1 and T2. A circuit configuration for the subtraction using the transformers can be operated at a low voltage and can minimize leakage current characteristics.

The mixer 140 is a sub-harmonic double balanced mixing circuit having four frequency multipliers FD1, FD2, FD3 and FD4. Each of the frequency multipliers comprises a pair of transistors that have collectors commonly connected to each other and emitters commonly connected to each other. In the sub-harmonic double balanced mixing circuit 140, a drive signal frequency f2 of four drive signals L01,L02,L03 and L04 is half of the input signal frequency f1 of the input signals RF1, RF2, RF3 and RF4. A first pair of drive signals L01 and L02 is 180° out of phase with respect to each other. A second pair of drive signals L03 and L04 is 180° out of phase with respect to each other. The first and second pair of drive signals are orthogonal to each other. The two pairs of drive signals are mixed at the mixer 140.

The mixer 140 has harmonic having a frequency of f1–2f2.

The first frequency multiplier FD1 has the collectors commonly connected to a first output node ON1 and the emitters commonly connected to one terminal of the second winding W2. A first base of the first frequency multiplier FD1 receives the first drive signal L01 having 0° phase. A second base of the first frequency multiplier FD1 receives the second drive signal L02 having about 180°-phase difference compared to the first drive signal L01.

The second frequency multiplier FD2 has collectors commonly connected to a second output node ON2 and the emitters commonly connected to one terminal of the second winding W2. A first base of the second frequency multiplier FD2 receives the third drive signal L03 having about 90°-phase difference compared to the first drive signal L01. A second base of the second frequency multiplier FD1 receives the fourth drive signal L04 having about 270°-phase difference compared to the first drive signal L01.

The third frequency multiplier FD3 has collectors commonly connected to a first output node ON1 and the emitters commonly connected to one terminal of the fourth winding W4. A first base of the third frequency multiplier FD3 receives the fourth drive signal L04 having about 270°-phase difference compared to the first drive signal L01. A second base of the third frequency multiplier FD3 receives the third drive signal L03 having about 90°-phase difference compared to the first drive signal L01.

The fourth frequency multiplier FD4 has collectors commonly connected to a second output node ON2 and the emitters commonly connected to one terminal of the fourth winding W4. A first base of the fourth frequency multiplier FD4 receives the second drive signal L02 having about 180°-phase difference compared to the first drive signal L01. A second base of the fourth frequency multiplier FD4 receives the first drive signal L01 having 0° phase.

A first load resistor R5 is connected between the voltage source VCC and the first output node ON1, and a second load resistor R6 is connected between the voltage source VCC and the second output node ON2. A capacitor C is coupled between the first output node ON1 and the second output node ON2.

Thus, in this embodiment, a secondary intermodulation distortion (IMD2) is minimized by the subtracter implemented by the RF transformer 130. A first output signal IF1 is output from the first output node ON1; and a second output signal IF2 is output from the second output node ON2. The first and second output signals IF1 and IF2 have about 180°-phase difference from each other.

Embodiment 2

Figure 3:
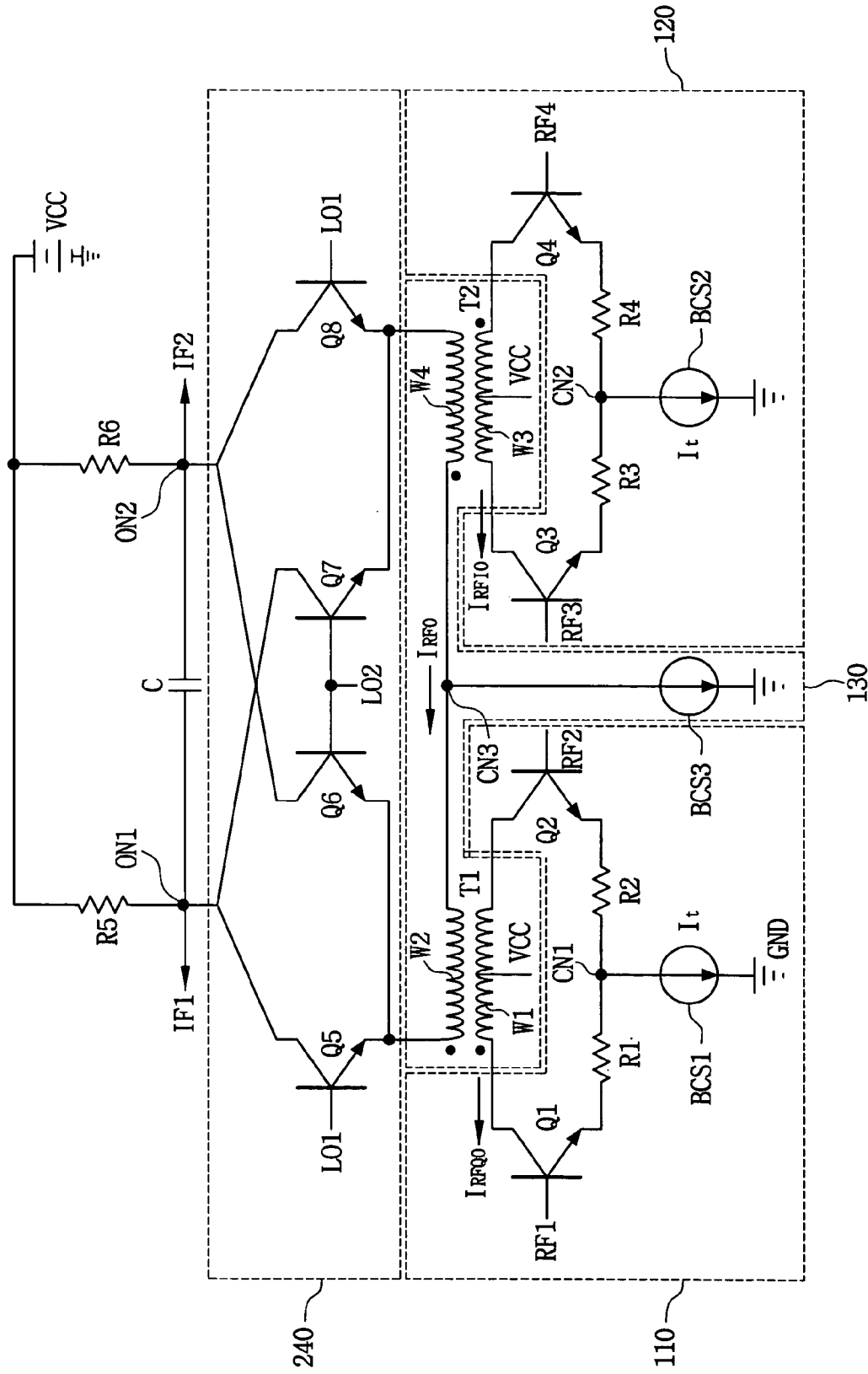
FIG. 3 is a circuit diagram of a harmonic rejection mixing circuit according to a second embodiment of the present invention.

FIG. 3 is a circuit diagram of a harmonic rejection mixing circuit according to a second embodiment of the present invention.

A frequency mixing circuit shown in FIG. 3 has the same configuration as the first embodiment of the frequency mixing circuit as shown in FIG. 2, except for the mixer 240. Therefore, in FIG. 3, the same reference numerals denote the same elements in FIG. 2, and thus the detailed description of the same elements will be omitted.

Referring to FIG. 3, the mixer 240 has a double balanced mixing circuit including a Gilbert cell circuit. Thus, the frequency of drive signals L01 and L02 is the same as the frequency of input signals RF1, RF2, RF3 and RF4.

A first pair of emitter coupled transistors Q5 and Q6 has emitters commonly connected to each other and connected to one terminal of the second winding W2. The collector of one of the first pair of emitter coupled transistors Q5 and Q6 is connected to the first output node ON1, and the collector of the other one of the first pair of emitter coupled transistors Q5 and Q6 is connected to the second output node ON2. Furthermore, the first pair of emitter coupled transistors Q5 and Q6 has a first base and a second base. The first base receives the first drive signal L01 having 0° phase and the second base receives the second drive signal L02 having about 180°-phase difference with respect to the first drive signal L01.

The second pair emitter coupled transistors Q7 and Q8 has emitters commonly connected to each other and connected to one terminal of the fourth winding W4. A third collector, of one of a second pair of emitter coupled transistors Q7 and Q8 is connected to the first output node ON1, and a fourth collector of the other one of the second pair of emitter coupled transistors Q7 and Q8 is connected to the second output node ON2. Furthermore, the second pair emitter coupled transistors Q5 and Q6 has a third base and a fourth base. The third base receives the second drive signal L02 having 180° phase difference with respect to the first drive signal L01, and the fourth base receives the first drive signal L01 having 0° phase.

Embodiment 3

Figure 4:
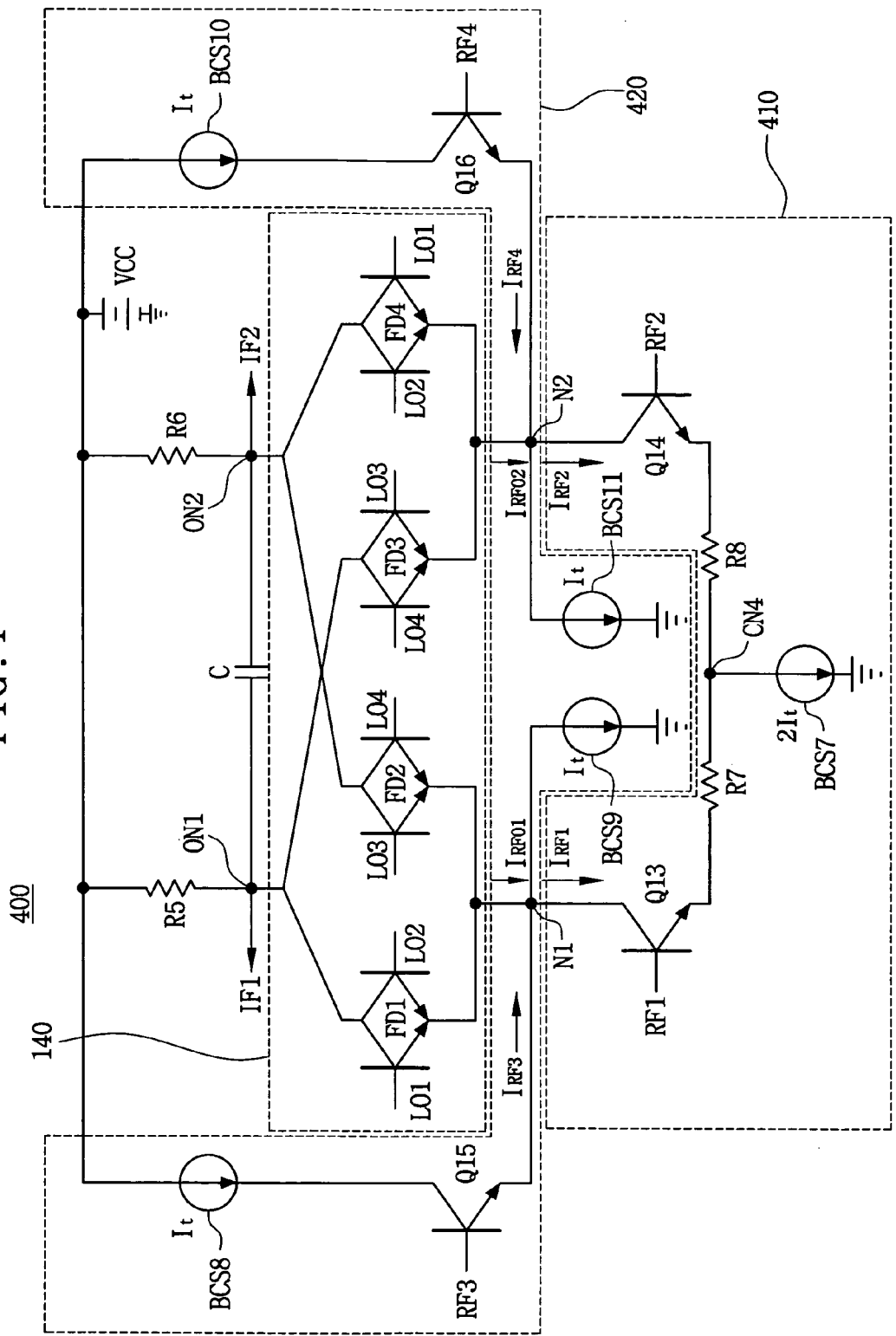
FIG. 4 is a circuit diagram of a harmonic rejection mixing circuit according to a third embodiment of the present invention.

FIG. 4 is a circuit diagram of a harmonic rejection mixing circuit according to a third embodiment of the present invention.

Referring to FIG. 4, a frequency mixing circuit 400 has a differential amplifier 410. The differential amplifier 410 amplifies a first pair of input signals RF1 and RF2 in order to output a first current signal $I_{RF1}$ and a second current signal $I_{RF2}$. =A current to flow at a first node N1 into transistor Q13 is the first current signal $I_{RF1}$ and a current to flow at a second node N2 into transistor Q14 is the second current signal $I_{RF2}$. The differential amplifier 410 has a pair of emitter coupled transistors Q13 and Q14 and a bias current source BCS7. Transistor Q13 has a collector connected to the first node N1, a base receiving the first input signal RF1 having 0° phase, and an emitter connected a common node CN4 via a regeneration resistor R7. Transistor Q14 has a collector connected to the second node N2, a base receiving the second input signal RF2 having about 180°-phase difference with respect to the first input signal RF1, and an emitter connected a common node CN4 via a regeneration resistor R8.

The bias current source BCS7 supplies a DC bias current $2I_t$ to the common node CN4, and is connected between the common node CN4 and a ground GND.

A harmonic rejection circuit 420 comprises a pair of transistors Q15 and Q16 and bias current sources BCS8-BCS11.

The transistor Q15 has an emitter connected to the first node N1, a base receiving a third input signal RF3 having about 90°-phase difference with respect to the first input signal RF1, and a collector connected to a voltage source VCC via the bias current source BCS8. Additionally, the bias current source BCS9 is connected between the first node N1 and the ground GND.

The transistor Q16 has an emitter connected to the second node N2, a base receiving a fourth input signal RF4 having about 270°-phase difference with respect to the first input signal RF1, and a collector connected to the voltage source VCC via the bias current source BCS10. Additionally, the bias current source BCS11 is connected between the second node N2 and the ground GND.

DC current values of the bias current sources BCS8-BCS11 are the same.

The transistor Q15 is turned on when the third input signal RF3 has positive value, and the transistor Q13 is turned on when the first input signal RF1 has positive value, so that the first current signal $I_{RF1}$ and a third current signal IRF3 have the opposite current direction from each other. The third input signal RF3 has about 90°-phase delay from the first input signal RF1. Thus, while the transistor Q13 is turned off, the transistor Q15 is turned on, so that a complementary current operation at the first node N1 occurs. Consequently, a current $I_{RE01}$ of the first node N1 is given by $I_{RE01} = I_t + (I_{RF1} - I_{RF3})$.

In the same manner, a current $I_{RE02}$ of the second node N2 is given by $I_{RE02} = I_t + (I_{RF2} - I_{RF4})$.

In this way, a mixer 140 receives a signal of which a secondary harmonics is removed by a subtraction for the input signals.

Exemplary Embodiments as a Frequency Receiving Circuit

Embodiment 5

Figure 6:
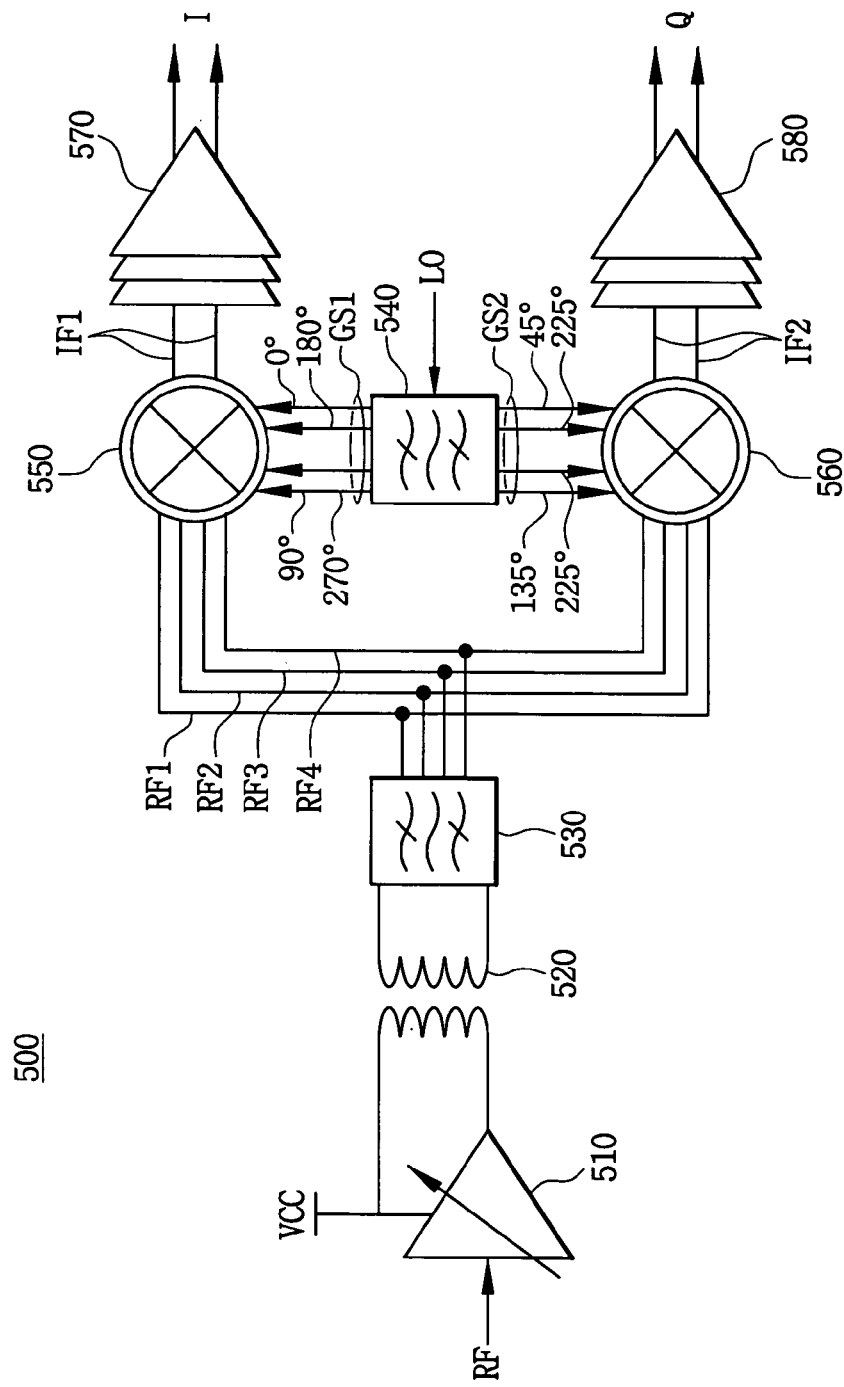
FIG. 6 is a block diagram of a radio frequency receiving circuit according to an exemplary embodiment of the present invention.

FIG. 6 is a block diagram of a radio frequency receiving circuit according to an exemplary embodiment of the present invention.

Referring to FIG. 6, a radio frequency signal RF of the radio frequency received to circuit 500 is transmitted into a first poly-phase filter 530 through a low noise amplifier 510 and a transformer 520. The first poly-phase filter 530 receives the radio frequency signal RF, and outputs a first pair of input signals RF1 and RF2 and a second pair of input signals RF3 and RF4. The first and second pairs of input signals are orthogonal to each other, so that the input signals RF1, RF2, RF3 and RF4 have phase difference of about 0°, 90°, 180° and 270° with respect to the input signal RF1, respectively.

Meanwhile, a local oscillator signal LO received at a second poly-phase filter 540 is transformed into a first signal group GS1 and a second signal group GS2 by separating the local oscillator signal LO. The first signal group GS1 has signals having phases of 0°, 90°, 180° and 270°. The second group GS2 has signals having phases of 45°, 135°, 225° and 315°. The signals of the first signal group GS1 have 45°-phase difference from the signals of the second signal group GS2, respectively.

The circuit configuration of the poly-phase filters 530 and 540 can be the same as or different from the poly-phase filter disclosed in U.S. Patent Laid-Open Publication No. 2001-38323.

Figure 5:
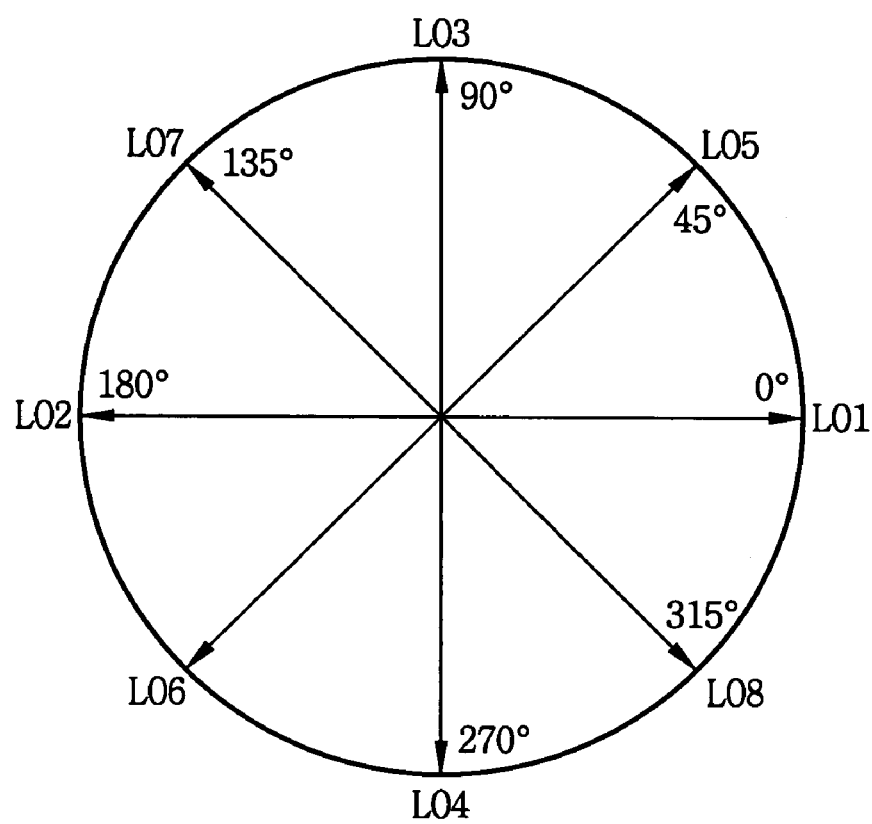
FIG. 5 is a phase diagram of drive signals shown in FIG. 6.

The first signal group GS1 comprises a first pair of drive signals L01 and L02 and a second pair of drive signals L03 and L04. The first pair of drive signals L01 and L02 are orthogonal to the second pair of drive signals L03 and L04. The second signal group GS2 has a third pair of drive signals L05 and L06 and a fourth pair of drive signals L07 and L08. The third pair of drive signals L05 and L06 are orthogonal to the fourth pair of drive signals L07 and L08. phase difference among the drive signals is shown by a phase diagram depicted in FIG. 5.

A first mixer 550 receives input signals RF1–RF4 and generates a first intermediate frequency signal IF1 by mixing input signals RF1–RF4 with frequency of the drive signals L01–L04 of the first signal group GS1.

A second mixer 560 receiving the input signals RF1–RF4 and generates a second intermediate frequency signal IF2 by mixing input signals RF1–RF4 with frequency of the drive signals L05–L08 of the second group signal GS2.

The first and second mixers 550 and 560 each comprise the sub-harmonic double balanced mixing circuit disclosed in the first, third and other embodiments of the frequency mixing circuit.

The first intermediate frequency signal IF1 generated by the first mixer 550 is amplified and low-pass filtered by a first amplifier 570, and whose DC offset is removed, so that a signal I inphase with the first intermediate frequency signal IF1 is generated.

The second intermediate frequency signal IF2 generated by the second mixer 560 is amplified and low-pass filtered by a second amplifier 580, and whose DC offset is removed, so that a signal Q orthogonal to the signal I is generated. Furthermore, the signal I and the signal Q have a baseband frequency.

Embodiment 6

Figure 7:
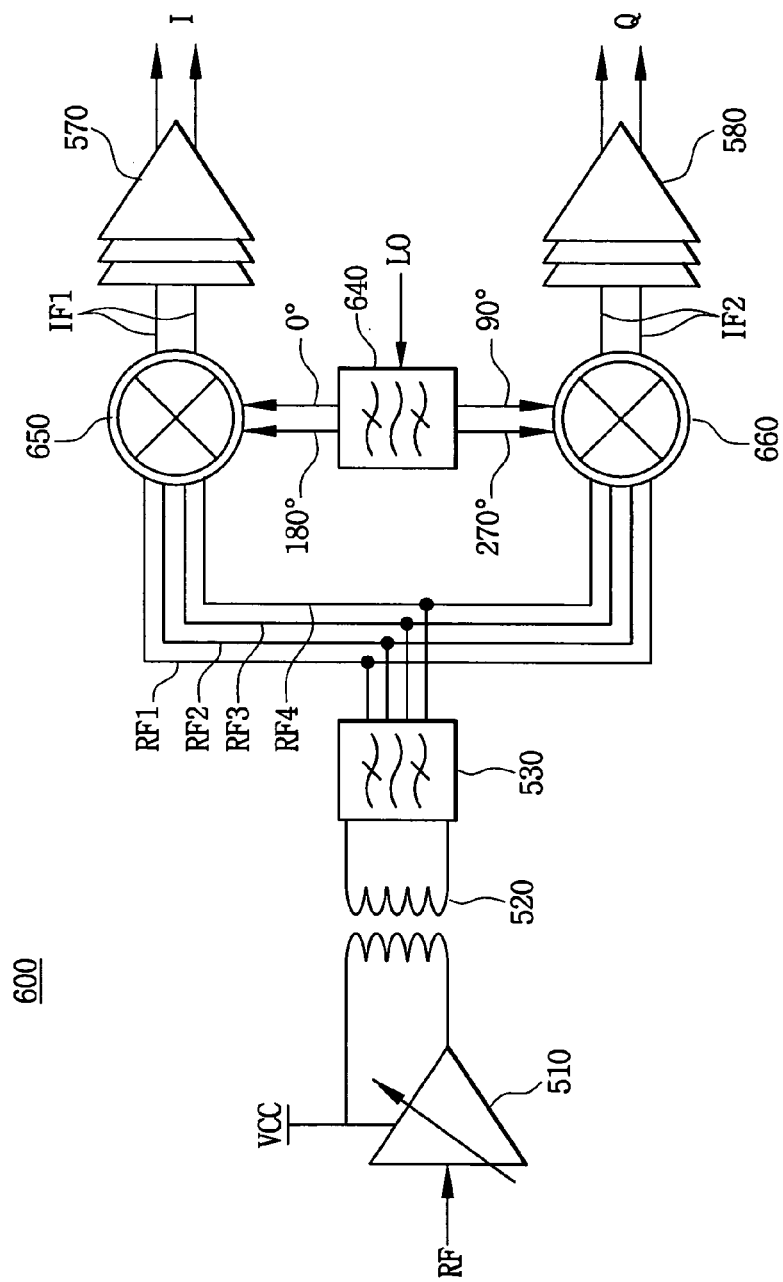
FIG. 7 is a block diagram of a radio frequency receiving circuit according to another exemplary embodiment of the present invention.

FIG. 7 is a block diagram of a radio frequency receiving circuit according to another exemplary embodiment of the present invention.

The radio frequency receiving circuit 600 shown in FIG. 7 has the same configuration as the radio frequency receiving circuit as shown in FIG. 6, except that a second poly-phase filter, a first mixer and second mixer have a different configuration from the embodiment of the radio frequency receiving circuit shown in FIG. 6. Therefore, in FIG. 7, the same reference numerals denote the same elements in FIG. 6, and thus the detailed description of the same elements will be omitted.

Referring to FIG. 7, a second poly-phase filter 640 receiving a local oscillator signal LO generates a first pair of drive signals L01 and L02 and a second pair of drive signals L03 and L04 by separating the local oscillator signal LO. The first and second pairs of drive signals are orthogonal to each other. Furthermore, a frequency f2 of the local oscillator signal LO is the same as a frequency f1 of the radio frequency signal RF.

A first mixer 650 receiving input signals RF1–RF4 generates a first intermediate frequency signal IF1 by mixing the first pair of drive signals L01 and L02.

A second mixer 660 receiving the input signals RF1–RF4 generates a second intermediate frequency signal IF2 by mixing with a frequency of the second pair of drive signals L03 and L04.

The first and second mixers 650 and 660 have the double balanced mixing circuit disclosed in the second embodiment of the frequency mixing circuit.

The present invention reduces the secondary intermodulation distortion IMD2 by changing the input structure of the mixing circuit receiving the radio frequency signal RF, so that removing the secondary harmonic improves the linearity of the mixing circuit and quality of receiving circuit.

While the exemplary embodiments of the present invention have been described in detail, it should be understood that various changes, substitutions and alterations can be made herein without departing from the scope of the invention as defined by the appended claims.

For example, the third and other embodiments of the frequency mixing circuit can include the Gilbert cell circuit as the mixer. The mixer may include a Gilbert cell circuit, a folded-cascode circuit or a harmonic mixer circuit.

Additionally, the frequency mixing circuit and the radio frequency receiving circuit may be fabricated via any known or future design technology, for example, BJT, MOS, CMOS, BiCMOS, HBT, MESFET and HEMT, and may be formed on any known or future semiconductor substrate such as Si substrate, SiGe substrate, GaAs substrate or InP substrate.

Furthermore, the transformer of the subtracter may be a monolithic microwave transformer on the semiconductor substrate that is known as balun (balance to unbalance transformer).

The first voltage source may have a positive voltage level (e.g., from 1V to 5V), and the second voltage source may have a negative voltage level from negative value to ground.

The circuits of the present invention may be applied to a cellular phone, a PCS (personal communication service) system, or a down converter and up converter of radio frequency transceiver such as a wireless LAN transceiver. The circuits of the present invention are adaptable to a direct conversion receiver of the cellular phone of a GSM (global system for mobile communications) having a frequency band of 900 MHz, and to a direct conversion receiver of the PCS system of the GSM having a frequency band of 1,800 MHz and 1,900 MHz.

What is claimed is:

1. A frequency mixer comprising:
    a first differential amplifier for amplifying a first pair of input signals (RF1, RF2) having a first frequency (f1) to output a first differential output signal;
    a second differential amplifier for amplifying a second pair of input signals orthogonal to the first input signals to output a second differential output signal, the second pair of input signals having a substantially same frequency as the first frequency (f1);
    a subtracter for subtracting the second differential output signal from the first differential output signal to output a subtracted output signal; and
    a mixer for mixing the subtracted output signal, and a first pair of drive signals having a second frequency (f2) and a second pair of drive signals orthogonal to the first pair of drive signals and having the second frequency (f2), wherein the mixer has a sub-harmonic double balanced mixing mode, and for outputting a pair of output signals orthogonal to each other, wherein at least one harmonic is cancelled from the output signals.

2. The frequency mixer of claim 1, wherein the second frequency (f2) is about half of the first frequency (f1).

3. The frequency mixer of claim 1, wherein the output signals belong to a baseband frequency.

4. The frequency mixer of claim 1, wherein a cancelled harmonic has a frequency of f1–2f2.

5. The frequency mixer of claim 1, wherein
    the subtracter includes a first transformer and a second transformer;
    the first transformer having a first polarity is inductively coupled to the first differential output signal of the first polarity and is connected between the first differential amplifier and the mixer; and
    the second transformer is inductively coupled to the second differential output signal of a second polarity that is opposite to the first polarity, and is connected between the second differential amplifier and the mixer.

6. The frequency mixer of claim 5, wherein
    the first differential amplifier has a first pair of emitter-coupled transistors and a first bias current source;
    each of transistors in the first pair of emitter coupled transistors has a collector that is conductively connected to a respective one of the two terminals of a first winding of the first transformer;
    a center tap of the first winding of the first transformer is connected to a first voltage source;
    the first pair of emitter-coupled transistors, wherein each transistor has a bases respectively receiving one input signal of the first pair input signals; and
    the first bias current source is connected between a common node between the emitters of the first pair of emitter coupled transistors and a second voltage source.

7. The frequency mixer of claim 6, wherein the mixer comprises;
    a first frequency multiplier connected between a first output node and a terminal of a second winding of the first transformer, switched by the first pair of drive signals,
    a second frequency multiplier connected between a second output node and the terminal of the second winding of the first transformer, switched by the second pair of drive signals.

8. The frequency mixer of claim 6, wherein the first differential amplifier further comprises a pair of regeneration resistors, each regeneration resistors being connected between an emitter of each transistor and the common node between the emitters of the emitter-coupled transistors.

9. The frequency mixer of claim 7 further comprising a capacitor connected between the first output node and the second output node.

10. A frequency mixer comprising:
    a first differential amplifier for amplifying a first pair of input signals having a first frequency (f1) for outputting a first differential output signal;
    a second differential amplifier for amplifying a second pair of input signals orthogonal to the first pair input signals having the first frequency (f1) and for outputting a second differential output signal;
    a subtracter for subtracting the second differential output signal from the first differential output signal and for outputting a subtracted output signal; and
    a mixer for mixing the subtracted output signal and a pair of drive signals having a second frequency (f2) in a double balanced mixing mode for outputting a pair of output signals orthogonal to each other wherein at least one harmonic is cancelled.

11. The frequency mixer of claim 10, wherein the first and second frequencies are substantially equal.

12. The frequency mixer of claim 10, wherein the output signals have a baseband frequency.

13. The frequency mixer of claim 10, wherein the harmonic has a frequency of f1–f2.

14. The frequency mixer of claim 10, wherein
the subtracter has a first transformer and a second transformer;
the first transformer is inductively coupled to the first differential output signal of a first polarity and is connected between the first differential amplifier and the mixer; and
the second transformer is inductively coupled to the second differential output signal of a second polarity that is opposite to the first polarity, and is connected between the second differential amplifier and the mixer.

15. The frequency mixer of claim 10, wherein
the first differential amplifier has a first pair of emitter coupled transistors and a first bias current source;
the first pair of emitter coupled transistors has two collectors each connected to a different one of two terminals of a first winding of the first transformer, respectively;
a center tap of the first winding of the first transformer is connected to a first voltage source; and
each transistor in the first pair of emitter coupled transistors has a base respectively receiving one of the first pair input signals; and
the first bias current source is connected between a common node of the first pair of emitter coupled transistors and to a second voltage source.

16. The frequency mixer of claim 15, wherein
the mixer has a third pair of emitter-coupled transistors and a fourth pair of emitter-coupled transistors,
each transistor of the third pair of emitter-coupled transistors has a collector respectively connected to a first output node and a second output node, and a base receiving the one of the pair of drive signals, respectively, and an emitter commonly connected to a terminal of a second winding of the first transformer;
each transistor of the fourth pair of emitter-coupled transistors has a collector respectively connected to the first and the second output node, a base receiving one of the pair of drive signals, respectively, and an emitter commonly connected to a terminal of a second winding of the second transformer.

17. A frequency mixer comprising:
a differential amplifier for amplifying a first pair of radio frequency (RF) input signals having a first frequency (f1) and for generating a first current signal at a first node and a second current signal at a second node;
a harmonic rejection circuit for processing a second pair of input signals orthogonal to the first pair of input signals and for generating a third current signal at the first node and a fourth current signal at the second node, the second pair of input signals having a substantially same frequency as the first frequency (f1); and
a mixer for mixing the current signals applied to the first and the second node with a first pair of drive signals and a second pair of drive signals being orthogonal to each other and having a second frequency (f2), in a sub-harmonic double balanced mixing mode, adapted to output a pair of output signals orthogonal to each other, a harmonic being cancelled from the output signals.

18. The frequency mixer of claim 17, wherein the harmonics rejection circuit comprises;
a first transistor coupled to a voltage source via a first bias current source, wherein a base of the first transistor receives one signal of the second pair input signals and an emitter of the first transistor is connected to the first node;
a second bias current source connected between the first node and a ground;
a second transistor coupled to the voltage source via a third bias current source, wherein a base of the second transistor receives a remaining signal of the second pair of input signals and an emitter of the second transistor is connected to the second node; and
a fourth bias current source connected between the second node and the ground.

19. The frequency mixer of claim 18, wherein
the differential amplifier has a first pair of emitter-coupled transistors and a fifth bias current source;
each transistor of the first pair of emitter-coupled transistors has a collector connected to the first and second nodes, respectively, and a base respectively receiving one of the first pair of input signals; and
the fifth bias current source is connected between a common node of the first pair of emitter-coupled transistors and a second voltage source.

20. The frequency mixer of claim 18, wherein a bias current of the fifth bias current source is about twice of a current of the first, second, third and fourth bias current sources.

21. A method comprising:
providing a first differential signal having a first frequency;
providing a second differential signal orthogonal to the first differential signal, and having a substantially same frequency as the first frequency;
subtracting the second differential signal from the first differential signal to output a subtracted signal; and
mixing the subtracted signal, and a first pair of drive signals and a second pair of drive signals orthogonal to each other having a second frequency, in a sub-harmonic double balanced mixing mode, to output a pair of output signals being orthogonal to each other, a harmonic being cancelled from the output signals.

22. A method comprising:
amplifying a first pair of input signals having a first frequency to output a first differential signal;
amplifying a second pair of input signals orthogonal to the first pair of input signals to output a second differential signal, the second pair of input signals having a substantially same frequency as the first frequency;
subtracting the second differential signal from the first differential signal to output a subtracted signal; and
mixing the subtracted signal with a pair of drive signals having a second frequency, in a sub-harmonic double balanced mixing mode, to output a pair of output signals orthogonal to each other, wherein a harmonic is cancelled in the output signals.

23. A method comprising:
amplifying a first pair of input signals, having a first frequency, to output first and second input signals;
subtracting respectively a third and fourth current signals from a first and second current signals to output a first and second subtracted signals wherein a second pair of input signals orthogonal to the first pair of input signals have a substantially same frequency as the first frequency; and mixing the first and the second subtracted signals, and a first pair of drive signals and a second pair of drive signals orthogonal to each other, in a sub-harmonic double balanced mixing mode, to output a pair of output signals orthogonal to each other, wherein the first pair of drive signals and the second pair of drive signals have a second frequency.

24. A frequency mixer comprising:

a first amplifier for amplifying a first input signal having a first frequency, to output a first amplified signal;

a second amplifier for amplifying a second input signal orthogonal to the first input signal, to output a second amplified signal, the second input signal having a substantially same frequency as the first frequency;

a subtracter for subtracting the second amplified signal from the first amplified signal, and for outputting a subtracted signal; and a mixer for mixing the subtracted signal with a drive signal having a second frequency, in sub-harmonic double balanced mixing mode, to output a output signal, a harmonic being cancelled from the output signal.

25. The frequency mixer of claim 24, wherein the first and second amplifiers are differential amplifiers.

26. The frequency mixer of claim 24, wherein the first and second input signals are 180° out of phase with respect to each other.

27. The frequency mixer of claim 26, wherein the drive signal has a first pair of drive signals and a second pair of drive signals orthogonal to each other.

28. The frequency mixer of claim 27, wherein the second frequency is about half of the first frequency.

* * * * *